United States Patent
Motz et al.

(10) Patent No.: US 8,829,988 B2
(45) Date of Patent: Sep. 9, 2014

(54) CHOPPED CIRCUIT WITH AC AND DC RIPPLE ERROR FEEDBACK LOOPS

(75) Inventors: Mario Motz, Wernberg (AT); Manfred Bresch, Villach (AT)

(73) Assignee: Infineon Technologies AG, Neubiberg (DE)

( * ) Notice: Subject to any disclaimer, the term of this patent is extended or adjusted under 35 U.S.C. 154(b) by 64 days.

(21) Appl. No.: 13/617,547

(22) Filed: Sep. 14, 2012

(65) Prior Publication Data
US 2014/0077873 A1    Mar. 20, 2014

(51) Int. Cl.
*H03F 1/02* (2006.01)

(52) U.S. Cl.
USPC .............................................. 330/9

(58) Field of Classification Search
USPC ................. 330/9, 85, 103, 104; 327/124, 307
See application file for complete search history.

(56) References Cited

U.S. PATENT DOCUMENTS

| | | | |
|---|---|---|---|
| 6,262,626 B1* | 7/2001 | Bakker et al. | 330/9 |
| 6,674,322 B2* | 1/2004 | Motz | 330/9 |
| 7,098,827 B2* | 8/2006 | Motz | 341/143 |
| 7,295,061 B1* | 11/2007 | Dasgupta | 330/9 |
| 7,492,149 B2 | 2/2009 | Motz et al. | |
| 7,764,118 B2* | 7/2010 | Kusuda et al. | 330/9 |
| 8,120,422 B1 | 2/2012 | Huijsing et al. | |
| 8,203,471 B2* | 6/2012 | Motz et al. | 341/144 |
| 2009/0261821 A1 | 10/2009 | Motz | |
| 2011/0215955 A1 | 9/2011 | Motz et al. | |

* cited by examiner

*Primary Examiner* — Khanh V Nguyen
(74) *Attorney, Agent, or Firm* — Eschweiler & Associates, LLC (57) ABSTRACT

The present disclosure relate to a sensor system having a low offset error. In some embodiments, the sensor system comprises a sensor configured to generate a sensor signal, which is provided to a main signal path having a first chopping correction circuit and a second chopping correction circuit. The first and second chopping correction circuit chop the sensor signal at first and second frequencies to reduce offset errors, but in doing so generate first and second chopping ripple errors. A first digital offset feedback loop generates a first compensation signal, which is fed back into the main signal path to mitigate the first chopping ripple error. A second digital offset feedback loop generates a second compensation signal, which is fed back into the main signal path to mitigate the second chopping ripple error.

20 Claims, 6 Drawing Sheets

CHOPPED CIRCUIT WITH AC AND DC RIPPLE ERROR FEEDBACK LOOPS

BACKGROUND

Many modern day electronic components utilize sensors to measure physical quantities and to convert the measured physical quantities into signals that are provided to an electronic instrument (e.g., integrated chip processor). In hand held portable devices (e.g., cell phones) sensors are ideally operated at a low power to enable long battery life. One way to conserve power is to use sensor signals having a small amplitude. However, to accurately convey information using signals with a small amplitude, offset values within the signals must be kept low.

Chopping switches are often used for linear amplifiers or analog-to-digital converts (ADCs) to achieve low offset values. Chopping switches can be operated to reduce the offset error by switching the outputs of the Hall plate at a chopping frequency that alternatively adds an offset value (e.g., 10 mV) and subtracts the offset value (e.g., −10 mV) from the induced Hall signal. Such chopping generates a modulated chopping signal at a chopping frequency, due to the swapping, that has an offset with a mean value of zero

DETAILED DESCRIPTION

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

It will be appreciated that although the disclosed chopper ripple error compensation feedback loops are described in relation to a sensor system, that disclosed ripple-compensation feedback loops are not limited to sensor systems. Rather, the disclosed chopper ripple error compensation feedback loops can be employed in any system wherein signals are to be processed with a low offset.

While chopping switches are an effective means to reduce offset errors within a signal, they produce a high-frequency chopper ripple error within a resulting signal. If the high-frequency chopper ripple error is not reduced, it causes a residual offset and in-band noise that reduces the dynamic range of the signal so that larger signal strengths must be used to effectively convey the signal. Chopper ripple errors can be reduced by using a filter to filter out the high frequency chopper ripple error. However, such filters consume a large amount of silicon area and therefore are expensive to implement on chip. Chopping ripple errors may also be reduced by using an analog feedback loop. However, in systems having multiple chopping elements, such feedback loops are unable to sufficiently mitigate chopper ripple errors, resulting in a residual offset that prevents the system from measuring input signals having a small amplitude value (e.g., <3 uV).

Accordingly, the present disclosure relate to a system having chopper offset correction that provides for a low offset error. In some embodiments, the system comprises a sensor configured to generate a sensor signal, which is provided to a main signal path having a first chopping correction circuit and a second chopping correction circuit. The first and second chopping correction circuits respectively chop the sensor signal at first and second frequencies to reduce offset errors, but in doing so generate first and second chopper ripple errors. A first digital feedback loop is configured to generate a first compensation signal, which is fed back into the main signal path to mitigate the first chopper ripple error. A second digital feedback loop is configured to generate a second compensation signal, which is fed back into the main signal path to mitigate the second chopper ripple error. By reducing the chopper ripple error using the first and second compensation signals, a sensor signal having a low offset is achieved.

Figure 1:
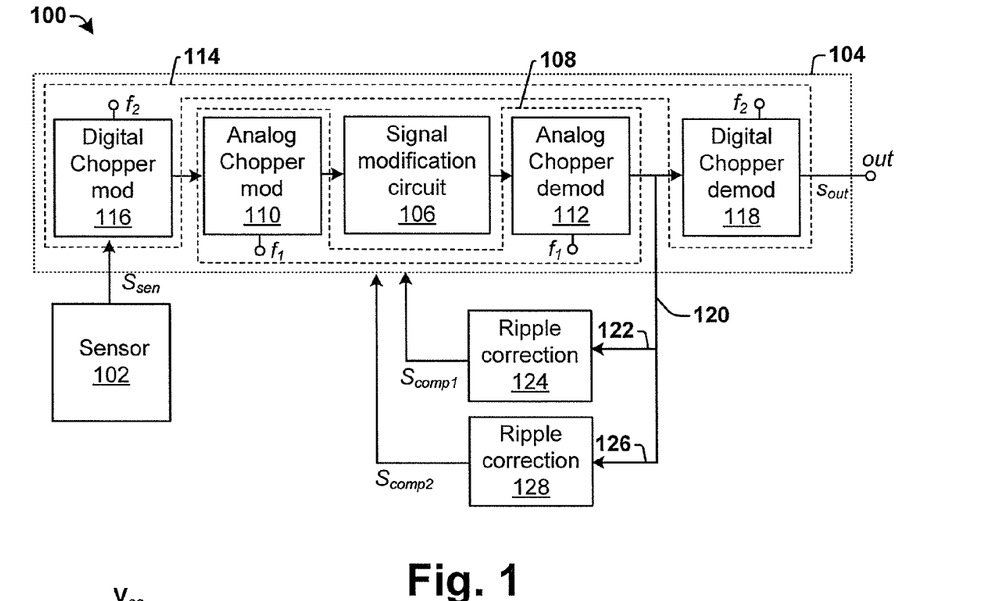
FIG. 1 is a block diagram of some embodiments of a system comprising feedback loops configured to mitigate offset errors in an input signal.

FIG. 1 is a block diagram of a disclosed system 100 having a plurality of feedback loops 122, 126 configured to mitigate chopper ripple errors within an input signal.

In some embodiments, the system 100 comprises a sensor 102 configured to generate a sensor signal $S_{sen}$ corresponding to a physical quantity measured by the sensor 102. In some embodiments, the sensor 102 comprises a bridge sensor. For example, the sensor 102 may comprise a magnetic Hall sensor configured to generate a sensor signal $S_{sen}$ corresponding to a measured magnetic field. Alternatively, the sensor 102 may comprise a pressure sensor configured to generate a sensor signal $S_{sen}$ corresponding to a measured pressure, for example. The sensor 102 may produce a sensor signal exhibiting an offset error.

The sensor signal $S_{sen}$ is provided from the sensor 102 to a main signal path 104 located between the sensor 102 and an output node out. The main signal path 104 comprises a signal modification circuit 106, and an analog chopping correction circuit 108 and a digital chopping correction circuit 114, which are respectively configured to chop the sensor signal $S_{sen}$ to reduce offset errors.

The signal modification circuit 106 is configured to modify a received sensor signal $S_{sen}$. In modifying the received sensor signal $S_{sen}$, the signal modification circuit 106 may introduce an offset error into the sensor signal $S_{sen}$. In some embodiments, the signal modification circuit 106 may comprise an amplifier element configured to increase the amplitude of the sensor signal $S_{sen}$. In other embodiments, the signal modification circuit 106 may comprise an analog-to-digital converter configured to convert a sensor signal $S_{sen}$ from an analog signal to a digital signal.

The analog chopping correction circuit 108 comprises a plurality of analog chopping elements respectively configured to modulate or demodulate the sensor signal $S_{sen}$ at a first frequency $f_1$ to reduce an offset error of the sensor signal $S_{sen}$ (e.g., due to the sensor 102 and/or to the signal modification circuit 106). While the analog chopping correction circuit 108 reduces offset errors within the sensor signal $S_{sen}$, in doing so generates a first chopper ripple error that is overlaid on the sensor signal $S_{sen}$. For example, an analog chopping correction circuit 108 configured to modulate and demodulate the sensor signal $S_{sen}$ at 40 KHz will effectively convert the offset error of the sensor signal $S_{sen}$ to a 40 KHz rectangular signal with a mean of zero, but with a first chopper ripple error.

In some embodiments, the analog chopping correction circuit 108 comprises an analog chopping modulator 110 and an analog chopping demodulator 112. The analog chopping modulator 110 is configured to chop a received sensor signal $S_{sen}$ at the first frequency $f_1$ (i.e., by toggling the polarity of the sensor signal $S_{sen}$ from a positive value to a negative value at the first frequency $f_1$) to generate a modulated signal. The modulated signal is demodulated by the analog chopping demodulator 112, which is configured to chop the modulated signal at the first frequency $f_1$.

The digital chopping correction circuit 114 comprises a plurality of digital chopping elements configured to further reduce an offset value of the sensor signal $S_{sen}$ by respectively modulating or demodulating the sensor signal $S_{sen}$ at a second frequency $f_2$, different than the first frequency $f_1$. Chopping the sensor signal $S_{sen}$ at the second frequency $f_2$ further reduces offset errors within the sensor signal $S_{sen}$, but in doing so generates a second chopper ripple error that is overlaid on the sensor signal $S_{sen}$. For example, a digital chopping correction circuit 114 configured to modulate and demodulate the sensor signal $S_{sen}$ at 600 Hz will effectively convert the offset error of the sensor signal $S_{sen}$ to a 600 Hz rectangular signal with a mean of zero, but with a second chopper ripple error.

In some embodiments, the digital chopping correction circuit 114 comprises a digital chopping modulator 116 and a digital chopping demodulator 118. The digital chopping modulator 116 is configured to chop a received sensor signal $S_{sen}$ at the second frequency $f_2$ (e.g., by toggling the polarity of the sensor signal $S_{sen}$ from a positive value to a negative value at the second frequency $f_2$) to generate a modulated signal. In some embodiments, the digital chopping modulator 116 comprises one or more chopping switches configured to invert a bias current input to the sensor 102. In other embodiments, the digital chopping modulator 116 comprises a chopping switch located in the main signal path 104. The modulated signal is demodulated by a digital chopping demodulator 118 configured to chop the modulated signal at the second frequency $f_2$. In some embodiments, the digital chopping correction circuit 114 comprises an outside digital loop so that the outside chopping switches do not introduce analog errors into the output signal $S_{out}$.

A feedback path 120 extends from the main signal path 104 to first and second feedback loops, 122 and 126. In some embodiments, the feedback path 120 extends from a – position between the analog chopping demodulator 112 and the digital chopping demodulator 118 to the first and second feedback loops, 122 and 126. In other embodiments, the feedback path 120 extends from a position downstream of the digital chopping demodulator 118 to the first and second feedback loops, 122 and 126.

The first feedback loop 122 comprises a first ripple correction element 124 and a second ripple correction element 128. The first ripple correction element 124 is configured to generate a first compensation signal $S_{comp1}$ that is provided to the main signal path 104 to mitigate the first chopper ripple error caused by the analog chopping correction circuit 108. The second feedback loop 126 comprises a second ripple correction element 128 configured to generate a second compensation signal $S_{comp2}$ that is provided to the main signal path 104 to mitigate the second chopper ripple error caused by the digital chopping correction circuit 114. By reducing the first and second chopper ripple errors using the first and second feedback loops, 122 and 126, the offset within the sensor signal $S_{sen}$ can have a small amplitude value (e.g., <1 uV) without-a noticeable chopper ripple error.

Figure 2:
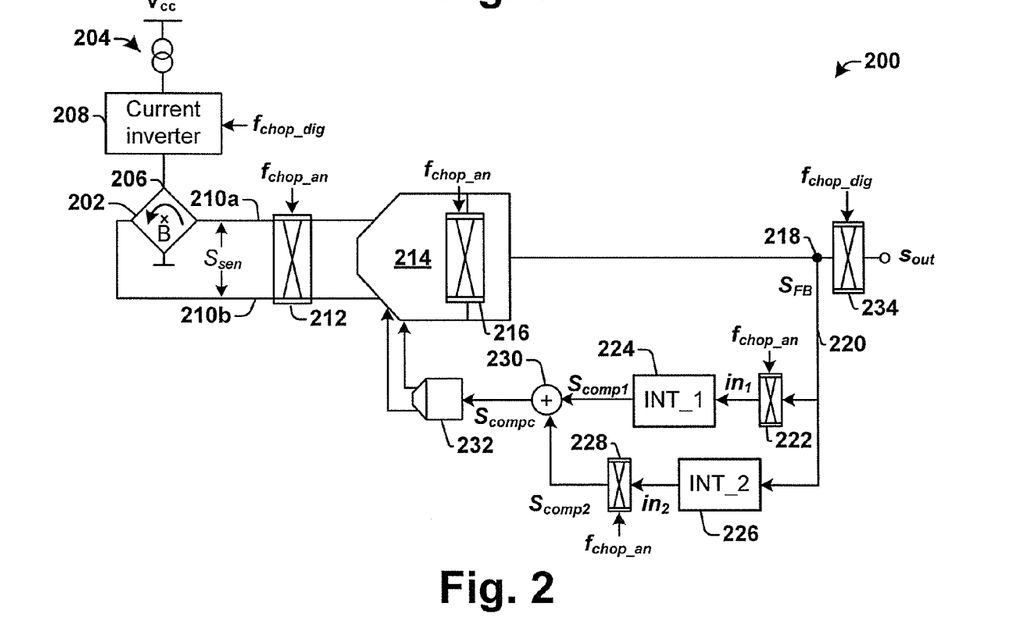
FIG. 2 is a block diagram of an embodiment of a sensor system having feedback loops configured to mitigate offset errors in a sensor signal.

FIG. 2 illustrates a more detailed embodiment of a disclosed sensor system 200.

The sensor system 200 comprises a magnetic sensor 202 employing a spinning Hall plate connected to a current source 204. An input terminal of the current source 204 is connected to a supply voltage source $V_{CC}$, while an output terminal of the current source 204 is configured to provide a bias current to one or more input terminals 206 of the magnetic sensor 202. The magnetic sensor 202 is configured to generate a differential sensor signal $S_{sen}$ corresponding to a measured magnetic field B.

In some embodiments, a current inverter 208 is configured to periodically change the direction of the bias current provided to the magnetic sensor 202. The current inverter 208 may be located upstream of the current source 204 or downstream of the current source 204. The current inverter 208 is configured to change the direction of the bias current at a second frequency $f_{chop\_dig}$, such that during a first clock period of the second frequency $f_{chop\_dig}$ the bias current travels in a first direction and during an adjacent, second clock period of the second frequency $f_{chop\_dig}$ the bias current travels in a second direction opposite the first direction. Reversing the direction of the bias current while keeping the magnetic field B the same alternates the sign of the sensor signal $S_{sen}$, so that the current inverter 206 effectively acts a digital chopper modulator that has the effect of chopping the sensor signal $S_{sen}$ output from the magnetic sensor 202 at the second frequency $f_{chop\_dig}$.

In some embodiments, the current inverter 208 may comprise one or more switches configured to turn the direction of the bias current applied to the magnetic sensor 202 (e.g., by exchanging pin connections to the magnetic sensor 202). In other embodiments, the current inverter 208 may change the spinning order of the Hall plate (e.g., from 0°/90°/180°/270° to 180°/270°/0°/90°).

The output of the magnetic sensor 202 is provided to an analog chopping modulator 212 by way of a differential signal path having a first differential path 210a and a second differential path 210b. The analog chopping modulator 212 is configured to chop the received sensor signal at a first frequency $f_{chop\_an}$ to generate a signal having an AC amplitude that varies at the first frequency $f_{chop\_an}$ with a DC offset. In some embodiments, the first frequency $f_{chop\_an}$ is greater than the second frequency $f_{chop\_dig}$. For example, chopper switches 206 and 208 may be configured to chop the sensor signal at a first frequency of 600 Hz, while analog chopping modulator 212 is configured to chop the sensor signal at a second frequency of 40 KHz.

The output of the analog chopping modulator 212 is provided to an analog-to-digital converter (ADC) 214 configured to convert the sensor signal from an analog signal to a digital signal. The ADC 214 contains an analog demodulator 216 that chops the sensor signal at the first frequency $f_{chop\_an}$ to reduce offset errors within the sensor signal. The analog demodulator 216 overlays the sensor signal with a first chopper ripple error resulting in an output signal comprising the sensor signal and an overlaid first chopper ripple error.

The output of the ADC 214 is provided to a digital demodulator 234 and to a feedback path 220. The digital demodulator 234 is configured to demodulate the sensor signal at the second frequency $f_{chop\_dig}$ to further reduce offset errors. The digital demodulator 234 reduces offset errors in sensor signal, but in doing so overlays the output signal with a second chopper ripple error, resulting in an output signal $s_{out}$ having a reduced offset but with first and second chopper ripple errors.

A feedback path 220 is connected to the main signal path at node 218. The feedback path 220 is configured to provide a feedback signal $S_{FB}$ to a first feedback loop and a second feedback loop configured to reduce the chopper ripple error in the sensor signal $S_{sen}$. The feedback signal $S_{FB}$ comprises an AC signal since an odd number of chopper elements are positioned between the sensor 202 and node 218.

The first feedback loop comprises a first chopping switch 222 configured to chop the feedback signal $S_{FB}$ at the first frequency $f_{chop\_an}$ to convert the chopper ripple in the feedback signal $S_{FB}$ to a first input signal $in_1$ that comprises a chopped version of the feedback signal $S_{FB}$. The first input signal $in_1$ is provided to a first digital integrator 224, which integrates the first input signal $in_1$ over time. Initially, the first input signal $in_1$ increases at a high rate of change. However, after a plurality of analog chopper cycles the first chopper ripple error is reduced, causing the first compensation signal $S_{comp1}$ to converge to (stabilize) a first compensation signal $S_{comp1}$ comprising an un-modulated (DC) digital integrated signal (centered around an offset $V_{off}$ in the sensor signal) that accounts for the first chopper ripple error in the sensor signal $S_{sen}$. The first compensation signal $S_{comp1}$ is fed back to ADC 214 where it cancels the first chopper ripple error (having a first frequency $f_{chop\_an}$) generated by the analog modulation and demodulation circuits, 212 and 216.

The second feedback loop comprises a second digital integrator 226 configured to integrate the feedback signal $S_{FB}$ over time to generate a second input signal $in_2$ comprising an integrated version of the feedback signal $S_{FB}$. A second chopping switch 228 is configured to receive the second input signal $in_2$ and to chop the second input signal $in_2$ at the first frequency $f_{chop\_an}$ to generate a second compensation signal $S_{comp2}$ therefrom. Initially, the second input signal $in_2$ increases at a high rate of change. However, as the chopper ripple error in the sensor signal is reduced, the second input signal $in_2$ levels off causing the second compensation signal $S_{comp2}$ to vary at the second frequency $f_{chop\_an}$ between a positive and negative value so as to provide an AC signal having a modulated value of the second digital integrator that mitigates for the second chopper ripple error (having a second frequency $f_{chop\_dig}$) in the sensor signal $S_{sen}$.

A digital-to-analog converter (DAC) 232 is configured to convert the first and second compensation signals, $S_{comp1}$ and $S_{comp2}$, from digital signals to analog correction signals that are fed back to ADC 214 to mitigate chopper ripple errors in the sensor signal.

In some embodiments, a summation element 230 is configured to receive the first and second compensation signals, $S_{comp1}$ and $S_{comp2}$. The summation element 230 adds the first un-modulated digital integrated signal ($S_{comp1}$) with the modulated value of the second digital integrator ($S_{comp2}$) to generate a composite compensation signal $S_{compc}$ that is provided as an input code to DAC 232. Based upon the received composite compensation signal $S_{compc}$, DAC 232 generates an analog correction signal that is provided to ADC 214. In some embodiments, the summation element 230 may be comprised within DAC 232, so that it is a node where currents are added together and not a digital adder. Since the first compensation signal $S_{comp1}$ comprises a DC feedback signal and the second compensation signal $S_{comp2}$ comprises an AC feedback signal, the resulting analog correction signal that cancels chopper ripple in the sensor signal.

Figure 3:
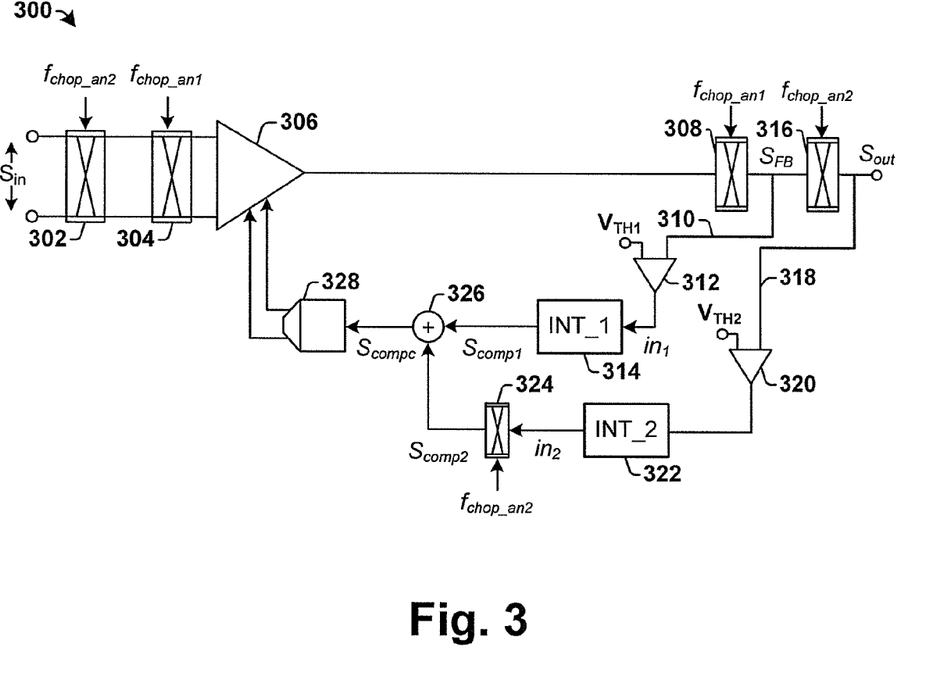
FIG. 3 is a block diagram of an alternative embodiment of a sensor system having feedback loops configured to mitigate chopper ripple errors in a sensor signal.

FIG. 3 illustrates an alternative embodiment of a disclosed sensor system 300 having chopping correction circuits configured to reduce offset within a main signal path comprising an amplifier 306.

The sensor system 300 comprises a first chopping modulator 302 configured to receive a differential input signal $S_{in}$ by way of a differential signal path. The first chopping modulator 302 is configured to chop the received input signal at a second frequency $f_{chop\_an2}$ and to output a modulated signal to a second chopping modulator 304 configured to chop a received signal at a first frequency $f_{chop\_an1}$. In some embodiments, the first frequency $f_{chop\_an1}$ is greater than the second frequency $f_{chop\_an2}$.

The output of the second chopping modulator 304 is provided to amplifier 306, which is configured to increase the amplitude of the input signal $S_{in}$. The amplifier 306 is configured to provide a single ended output signal to a first chopping demodulator 308. The first chopping demodulator 308 is configured to chop a received signal at the first frequency $f_{chop\_an1}$. The output of the first chopping demodulator 308 is provided to a second chopping demodulator 316 and a first feedback path 310. The second chopping demodulator 316 is further configured to chop a received signal at the second frequency $f_{chop\_an2}$ to generate a DC output signal $s_{out}$ with first and second ripple to errors. The output of the second chopping demodulator 316 is provided to an output node and a second feedback path 318.

The first feedback path 310 is configured to provide the output of the first chopping demodulator 308 to a first comparator 312, which is configured to convert an analog signal to a digital signal. The first comparator 312 compares the output of the first chopping demodulator 308 to a first threshold value $V_{TH1}$ to generate a first binary output signal. The first binary output signal is provided to a first digital integrator 314, which integrates accordingly to a value of the first binary output signal. For example, in some embodiments, the first threshold value $V_{TH1}$ is equal to approximately zero so that the first comparator 312 outputs a signal that is based upon a sign of the signal output from first chopping demodulator 308. The first digital integrator 314 effectively determines if the signal output from first chopping demodulator 308 is positive or negative. If the signal is positive, the first digital integrator 314 integrates the signal to form a first compensation signal $S_{comp1}$ (a DC feedback signal) that is provided to a first input of a summation element 326.

The second feedback path 318 is configured to provide the output of the second chopping demodulator 316 to a second comparator 320, which is configured to convert an analog signal to a digital signal. The second comparator 320 compares the output of the second chopping demodulator 316 to a second threshold value $V_{TH2}$ to generate a second binary output signal. The second binary output signal is provided to a second digital integrator 322 that integrates according to a value of the second binary output signal. For example, in some embodiments, the second threshold value $V_{TH2}$ is equal to approximately 0 so that the second comparator 320 outputs a signal that is based upon a sign of the signal output from the second chopping demodulator 316. The second digital integrator 322 effectively determines if the signal is positive or negative. If the signal is positive the second digital integrator 322 integrates the signal. The integrated signal is provided to a chopping switch 324 that forms a second compensation signal $S_{comp2}$ (an AC feedback signal) that is provided to a second input of a summation element 326.

The summation element 326 is configured to receive and add together the first and second compensation signals, $S_{comp1}$ and $S_{comp2}$, to generate a composite compensation signal $S_{compc}$ that is provided as an input code to a digital-to-analog converter (DAC) 328. Based upon the received composite compensation signal $S_{compc}$, the DAC 328 generates an analog correction signal that is fed back to an input stage of the amplifier 306 as a differential current.

Figure 4A:
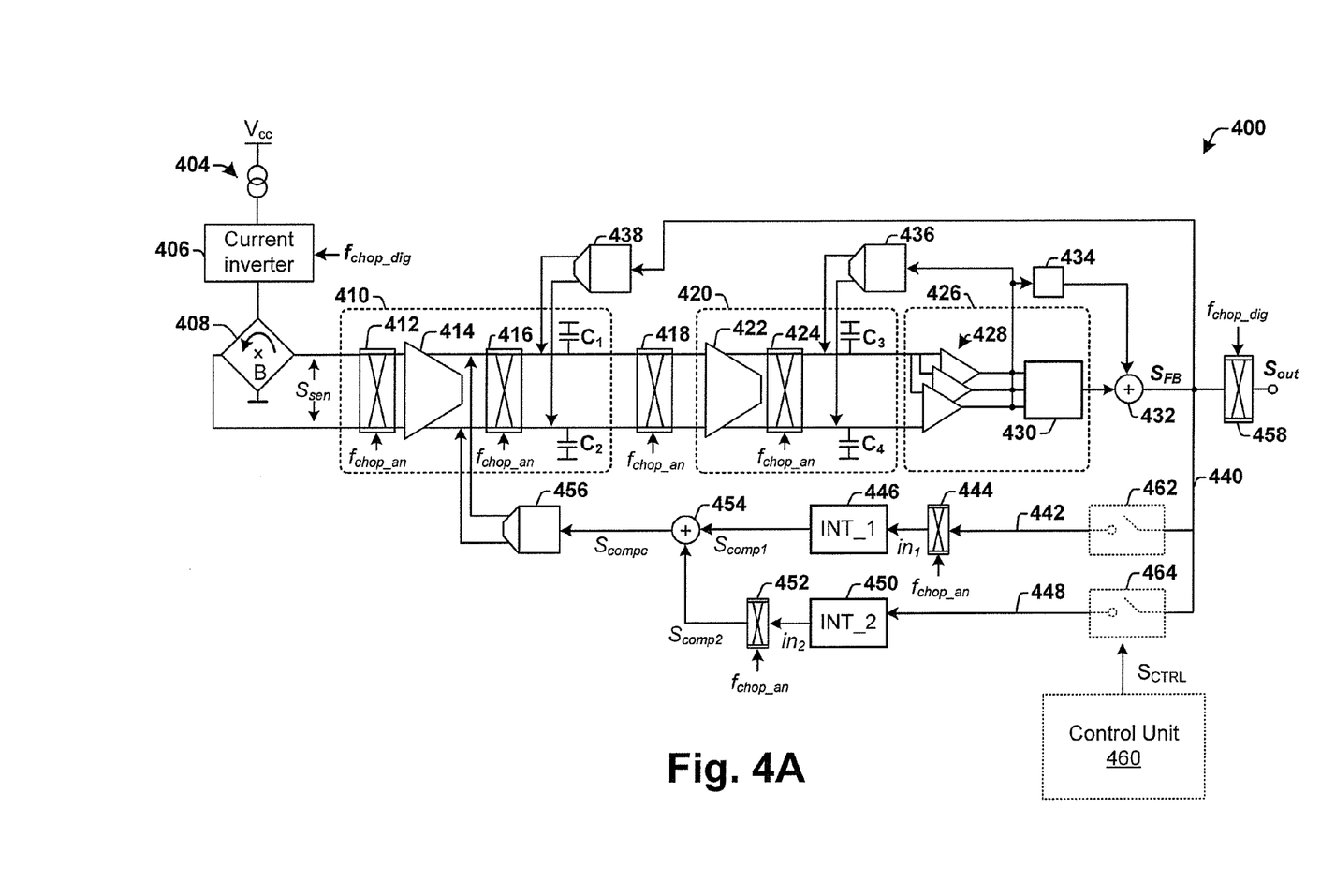
FIG. 4A illustrates a more detailed embodiment of a sensor system having feedback loops configured to mitigate chopper ripple errors in a sensor signal.

FIG. 4A illustrates a block diagram of a more detailed embodiment of a disclosed sensor system 400 configured to reduce offset errors and associated chopper ripple errors.

The sensor system 400 comprises a current source 404 connected between a supply voltage source $V_{CC}$ and a spinning Hall plate sensor 408. The current source 404 is configured to provide a bias current through the spinning Hall plate sensor 408. The bias current enables the spinning Hall plate sensor 408 to sense a magnetic field and to output a sensor signal $S_{sen}$ corresponding to a sensed magnetic field.

In some embodiments, a current inverter 406 is located downstream of the current source 404 and is configured to invert the bias current (i.e., change the direction of the bias current) provided to the spinning Hall plate 408 at a second frequency $f_{chop\_dig}$. Inverting the input bias current causes the spinning Hall plate 408 to generate a sensor signal $S_{sen}$ that is effectively chopped at the second frequency $f_{chop\_dig}$. The sensor signal is provided to a sigma delta ADC comprising a first analog integrator 410 connected in series with a second analog integrator 420 and a first digital integrator 426.

The first analog integrator 410 comprises a first analog chopping switch 412 configured to chop or modulate the received sensor signal at a first frequency $f_{chop\_an}$ to produce a chopped or modulated signal. The chopped or modulated signal is provided to a first transconductance amplifier 414, which amplifies the chopped signal. The amplified chopped signal then is provided to a second analog chopping switch 416 configured to chop or demodulate a received signal at the second chopping frequency $f_{chop\_an}$. The output of the second analog chopping switch 416 is combined with analog feedback signals output from a first digital-to-analog converter (DAC) 438 by way of capacitors $C_1$ and $C_2$. In some embodiments, the chopping switches 418 and 424 can be omitted from the sensor system 400.

A third analog chopping switch 418 is configured to chop or modulate the output of the first analog integrator 410 at the first chopping frequency $f_{chop\_an}$ and to provide a chopped signal to the second analog integrator 420. The second analog integrator 420 comprises a second transconductance amplifier 422 configured to amplify the chopped signal. The output of the second transconductance amplifier 422 is provided to a fourth analog chopping switch 424 configured to chop or demodulate a received signal at the first chopping frequency $f_{chop\_an}$. The output of the fourth analog chopping switch 424 is combined with the analog feedback signals output from a second digital-to-analog converter (DAC) 436 by way of capacitors $C_3$ and $C_4$.

The first digital integrator 426 is configured to receive the output of the second analog integrator 420. The first digital integrator 426 comprises one or more comparators 428 configured to determine a sign of the output of the second analog integrator 420. The output of the comparators 428 is provided to a feedback loop that feeds the output of the comparators 428 to the second DAC 436 and to a divider 434. The output of the comparators 428 is also provided to a digital integrator 430, which integrates the signals to generate an output signal. In some embodiments, the output of the digital integrator 430 is added to an output of divider 434 to generate the output signal. Due to the even number of chopping modulators and demodulators in the main signal path, the output signal comprises a DC signal overlaid with an AC chopper ripple.

A feedback path 440 is connected to a first feedback loop 442 and a second feedback loop 448. The first feedback loop 442 comprises fifth analog chopping switch 444 and a second digital integrator 446. The fifth analog chopping switch 444 chops a feedback signal at the first frequency $f_{chop\_an}$. In one embodiment, fifth analog chopping switch 444 alternatively multiplies the feedback signal by a positive one in a first chopping phase by a negative one in a next chopping phase. The second digital integrator 446 accumulates the multiplication results in consecutive chopping phases to provide a first compensation signal $S_{comp1}$ comprising a DC signal.

The second feedback loop 448 comprises a third digital integrator 450 and a sixth analog chopping switch 452. The third digital integrator 450 is configured to integrate the output signal over a plurality of chopping phases. The sixth analog chopping switch 452 is configured to receive the output of the third digital integrator 450 and to chop the output at the first frequency $f_{chop\_an}$ to generate an AC ripple error in the digital output signals to generate a second compensation signal $S_{comp2}$.

A summation element 454 is configured to add the first and second compensation signals, $S_{comp1}$ and $S_{comp2}$, to generate a composite compensation signal $S_{compc}$ that is provided to a digital-to-analog converter (DAC) 456, which converts the composite compensation signal $S_{compc}$ into an analog correction signal that is combined with the output of first transconductance amplifier 414 to reduce chopper ripple errors in the sensor signal $S_{sen}$. In some embodiments, the sensor system 400 operates to iteratively adjust the analog feedback signal to eliminate or reduce chopper ripple errors.

In some embodiments, a control unit 460 is configured to generate a control signal $S_{CTRL}$ that selectively activates one or more of the feedback paths 442 or 448 by way of one or more switching elements 462 or 464. For example, the control unit 460 may activate the first feedback loop 442 but not the second feedback loop 448 so that the first compensation signal $S_{comp1}$ is generated to mitigate chopper ripple errors generated by analog chopping switches in the main signal path. Alternatively, the control unit 460 may deactivate the first feedback loop 442 and activate the second feedback loop 448 that the second compensation signal $S_{comp2}$ is generated to mitigate chopper ripple errors generated by digital chopping switches in the main signal path.

Figure 4B:
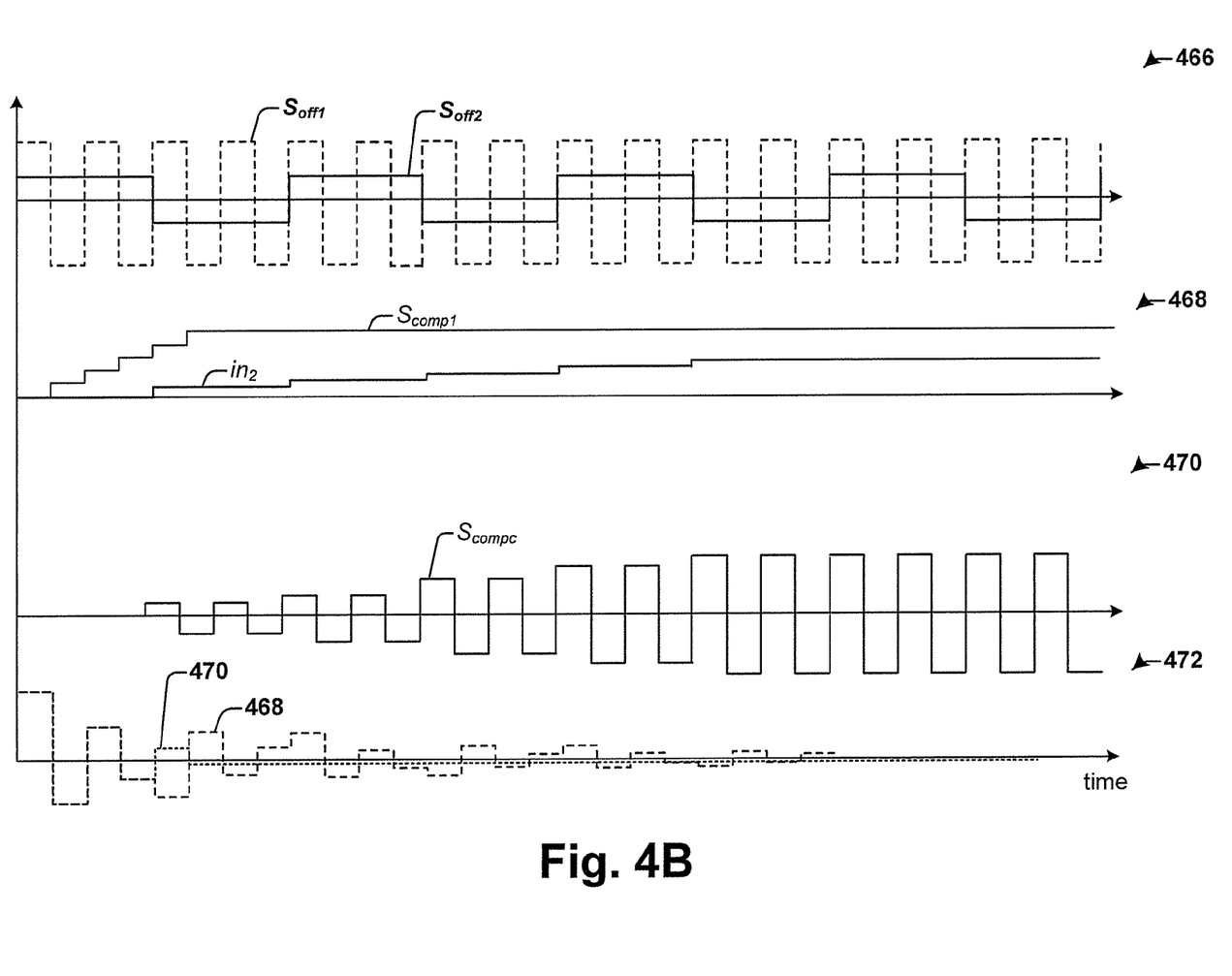
FIG. 4B is a timing diagram illustrating exemplary signals in the sensor system of FIG. 4A.

FIG. 4B illustrates timing diagram illustrating operation of sensor system 400.

In particular, graph 466 illustrates the offset $S_{off1}$ generated by the spinning Hall plate 408 (i.e., an offset present in the sensor signal $S_{sen}$) and the offset $S_{off2}$ generated by the delta sigma ADC. Since the spinning Hall plate 408 is inverted based upon a chopping signal having a second frequency $f_{chop\_dig}$, the chopping period of the offset $S_{off1}$ generated by the spinning Hall plate 408 is smaller than offset $S_{off2}$ generated by the ADC, which operates on the first frequency $f_{chop\_an}$.

Graph 468 illustrates the first compensation signal $S_{comp1}$ and the second input signal $in_2$, respectively generated by first and second feedback loops, 442 and 448. The first compensation signal $S_{comp1}$ increases at a first frequency $f_{chop\_an}$ over a time until it settles at a DC value that cancels the offset $S_{off2}$ (and chopper ripple error) generated by the ADC. The second input signal $in_2$ increases its value over time at a second frequency $f_{chop\_dig}$, until it settles at an AC amplitude that cancels the offset $S_{off1}$ (and chopper ripple error) generated by the spinning Hall plate 408.

Graph 470 illustrates a composite compensation signal $S_{compc}$ for a simplified case where the first feedback loop 442 is deactivated. The composite compensation signal $S_{compc}$ is equal to a sum of the first and second compensation signals, $S_{comp1}$ and $S_{comp2}$. However, since the first feedback loop 442 is deactivated, the composite compensation signal $S_{compc}$ is equal to the second input signal $in_2$ chopped at the first frequency $f_{chop\_an}$. The composite compensation signal $S_{compc}$ varies between a positive value at the first frequency $f_{chop\_an}$ since the second feedback loop operates at the first frequency $f_{chop\_an}$. The amplitude of the second compensation signal $S_{comp2}$ increases over time, until the amplitude settles at the AC amplitude.

Graph 472 illustrates signals showing a comparison between with and without an output signal having chopping correction circuits configured to chop at the first frequency and a second feedback loop. In particular, lines 466 shows the ADC output without the digital chopper loop and a second feedback signal, while line 468 shows the ADC output with the digital chopper loop and second feedback signal. Line 468 settles to a value of approximately zero offset, while line 470 settles to a value that is larger than that of line 468. Therefore, the additional second feedback loop improves offset reduction in sensor system 400.

It will be appreciated that the location of the illustrated feedback loops (e.g., shown in FIGS. 3 and 4A) are non-limiting examples of feedback loops that may be used to mitigate the chopper ripple errors. In other embodiments, the location of the feedback loops may vary to provide for signals that effectively mitigate the chopper ripple errors generated by chopping correction circuits.

Figure 5:
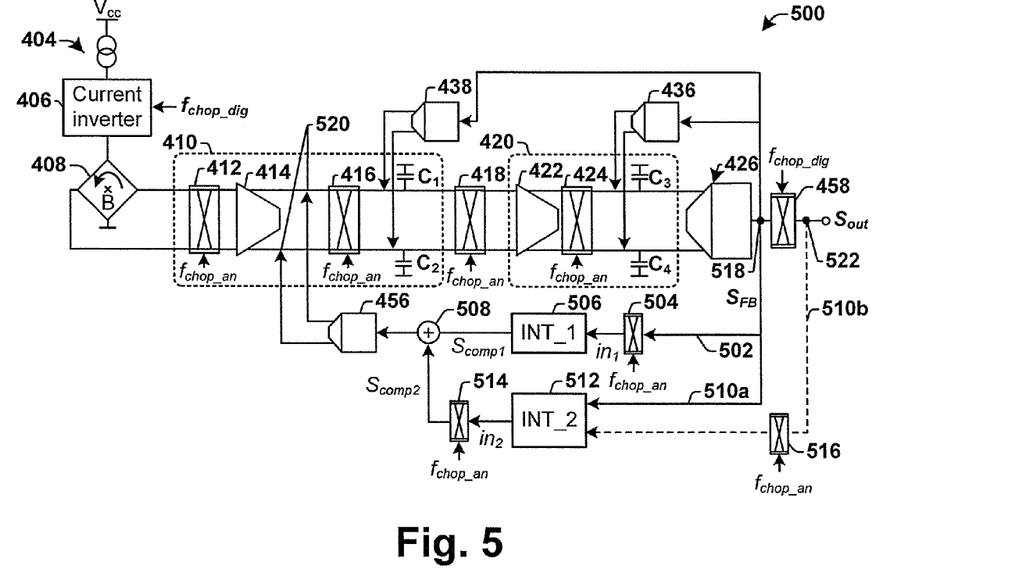
FIG. 5 illustrates some embodiments of a sensor system having feedback loops.

For example, FIG. 5 illustrates some embodiments of a sensor system 500 having alternative feedback loops configured to mitigate chopper ripple errors.

The sensor system 500 comprises a first feedback loop 502 extending from an output node 518 to input nodes 520. The first feedback loop 502 is configured to convert the chopper ripple error to a DC feedback signal that is provided to input nodes 520. In some embodiments, the first feedback loop comprises an analog chopping switch 504 that chops the feedback signal at a first frequency $f_{chop\_an}$. The analog chopping switch 504 provides for an even number of chopping switches between the input nodes and the first digital integrator 506. The even number of chopping switches causes the first feedback loop 502 to generate a first compensation signal $S_{comp1}$ comprising a DC signal that accounts for AC ripple errors at a frequency of $f_{chop\_an}$ in the sensor signal $S_{sen}$. In particular, the DC signal of the first compensation signal $S_{comp1}$ is modulated by chopper switch 416 to an AC amplitude that mitigates the first chopper ripple error (e.g., generated due to cancelling of the demodulated DC offset of integrator stage 414). The first compensation signal $S_{comp1}$ is provided to a first input node of a summation element 508.

While the first feedback loop 502 mitigates DC ripple errors in the sensor signal, it is unable to cancel higher frequency AC ripple errors. Accordingly, the second feedback loop 510a is configured to receive the feedback signal $S_{FB}$ and to generate a second compensation signal $S_{comp2}$ comprising an AC signal.

In some embodiments, the second feedback loop 510a extends from an output node 518 to input nodes 520. In such an embodiment, the second feedback loop 510a may comprise a second digital integrator 512 that integrates the feedback signal and a second analog chopping switch 514. Since an odd number of chopping switches are located between the input nodes and the second digital integrator 512, the second feedback loop 510a generates a second compensation signal $S_{comp2}$ comprising an AC signal that accounts for AC ripple errors with a frequency of $f_{chop\_dig}$ in the sensor signal $S_{sen}$.

In other embodiments, the second feedback loop 510b the second feedback loop 510a extends from an output node 522 to input nodes 520. In such an embodiment, the second feedback loop 510a may comprise an additional chopping switch 516 located upstream of the second digital integrator 512. The additional chopping switch 516 causes an odd number of chopping switches to be located between the input nodes and the second digital integrator 512. Since an odd number of chopping switches are located between the input nodes and the second digital integrator 512, the second feedback loop 510b generates a second compensation signal $S_{comp2}$ comprising an AC signal that accounts for AC ripple errors in the sensor signal $S_{sen}$.

Figure 6:
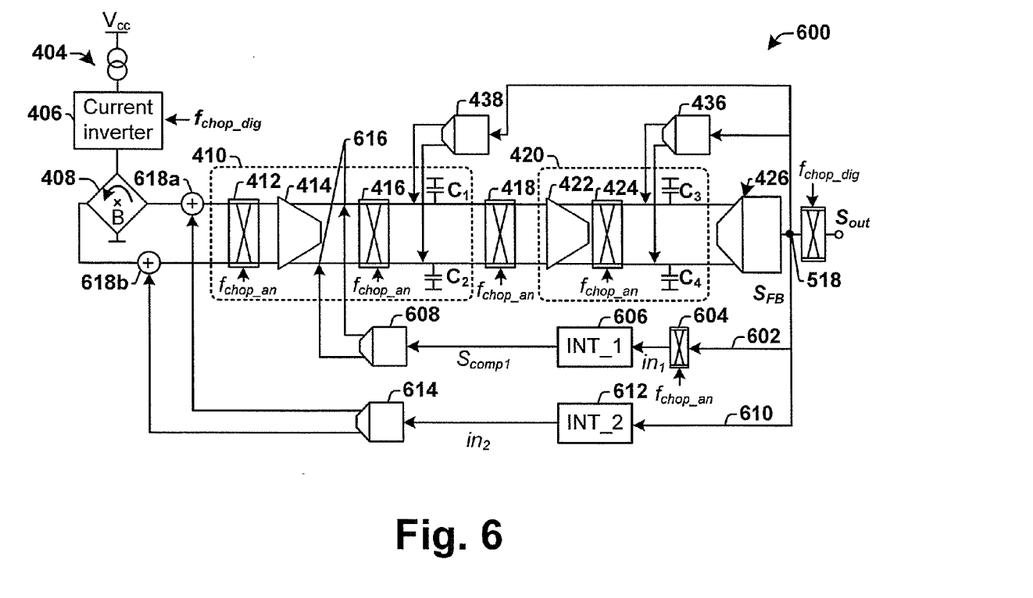
FIG. 6 illustrates some embodiments of a sensor system having feedback loops.

FIG. 6 illustrates some alternative embodiments of a sensor system 600 having alternative feedback loops configured to mitigate chopper ripple errors.

The sensor system 600 comprises a first feedback loop 602 and a second feedback loop 610. The first feedback loop 602 extends from an output node 518 to first input nodes 616. The first feedback loop 602 is configured to convert the chopper ripple error to a first compensation signal $S_{comp1}$ comprising a DC feedback signal that is provided to a first DAC 608 that provides an analog correction signal to input nodes 616. In some embodiments, the first feedback loop 602 comprises an analog chopping switch 604 that chops the feedback signal at a first frequency $f_{chop\_an}$. The analog chopping switch 604 provides for an even number of chopping elements between the input nodes 616 and the first digital integrator 606. The even number of chopping elements causes the first feedback loop 602 to generate a first compensation signal $S_{comp1}$ comprising a DC signal that accounts for ripple errors in the sensor signal $S_{sen}$.

The second feedback loop 610 extends from the output node 518 to second input nodes, 618a and 618b, upstream of the first analog chopping switch 412. In some embodiments, the second feedback loop 610 comprises a second digital integrator 612 configured to output a second input signal $in_2$ to a second DAC 614. Along the second feedback path 610, an even number of chopping elements between the second input nodes, 618a and 618b, and the second digital integrator 612. The even number of chopping elements causes the first feedback loop 602 to generate a second input signal $in_2$ comprising a DC signal that accounts for ripple errors in the sensor signal $S_{sen}$ and the corresponding output signal $S_{out}$.

Figure 7:
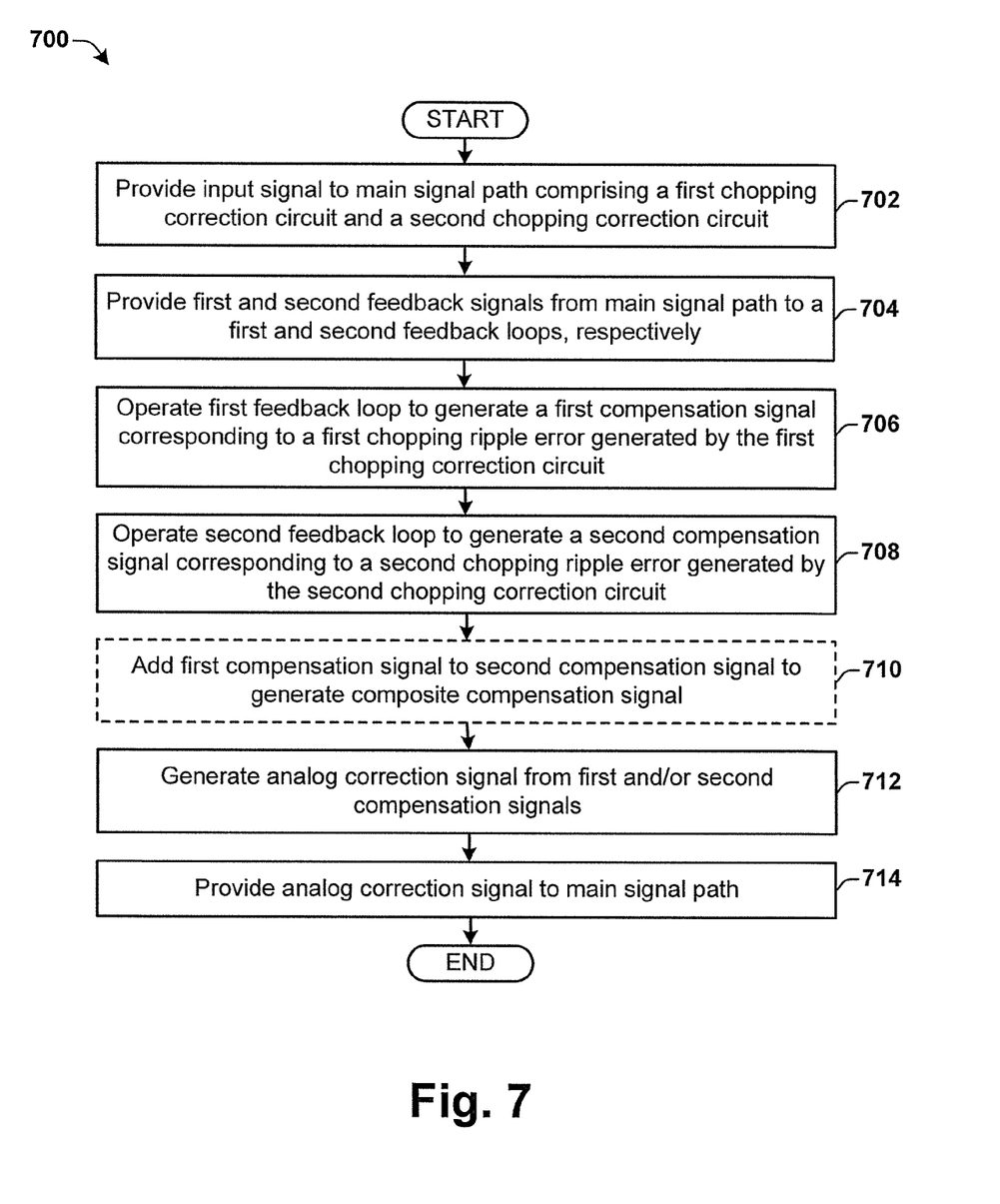
FIG. 7 is a flow diagram of an exemplary method of reducing offset errors in a sensor signal.

FIG. 7 is a flow diagram of an exemplary method 700 of an exemplary method of reducing offset errors in a sensor signal.

It will be appreciated that while method 700 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At 702, an input signal is provided to a main signal path comprising a first chopping correction circuit and a second chopping correction circuit. In some embodiments, the input signal comprises a sensor signal provided from a sensor to the main signal path. The first chopping correction circuit is configured to reduce offset errors within the input signal, but in doing so generates a first chopper ripple error. The second chopping correction circuit is configured to further reduce offset errors within the input signal, but in doing so generates a second chopper ripple error.

At 704, a first feedback signal is provided from the main signal path to a first feedback loop and a second feedback signal is provided from the main signal path to a second feedback loop. In some embodiments, the first and second feedback signals comprise a same signal from a same location in the main signal path. In other embodiments, the first and second feedback signals comprise separate feedback signals from separate locations in the main signal path.

At 706, the first feedback loop is operated to generate a first compensation signal that mitigates the first chopping ripple error generated by the first chopping correction circuit. The first compensation signal comprises a DC signal generated based upon a feedback signal output from the main signal path.

At 708, the second feedback loop is operated to generate a second compensation signal that mitigates the second chopping ripple error generated by the second chopping correction circuit. The second compensation signal comprises an AC signal generated based upon a feedback signal output from the main signal path.

At 710, the first and second compensation signals are added together to generate a composite compensation signal, in some embodiments.

At 712 an analog correction signal is generated from the first and or second compensation signals. In some embodiments, the analog correction signal is generated from the composite compensation signal.

At 714, the analog correction signal is provided to the main signal path by way of a feedback path.

It will be appreciated that equivalent alterations and/or modifications may occur to those skilled in the art based upon a reading and/or understanding of the specification and annexed drawings. The disclosure herein includes all such modifications and alterations and is generally not intended to be limited thereby. For example, although the disclosed system is illustrated as having two offset correction circuits and two feedback loops, one of ordinary skill in the art will appreciate that a disclosed system may comprise more than two offset correction circuits and/or feedback loops.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A system, comprising:
    a main signal path configured to receive an input signal, comprising:
        a first chopping correction circuit configured to chop the input signal at a first frequency to reduce an offset error in the input signal; and
        a second chopping correction circuit configured to chop the input signal at a second frequency to further reduce the offset error;
    a first feedback loop configured to generate a first compensation signal, which is fed back to the main signal path to mitigate a first chopper ripple error generated by the first chopping correction circuit; and
    a second feedback loop configured to generate a second compensation signal, which is fed back to the main signal path to mitigate a second chopper ripple error generated by the second chopping correction circuit.

2. The system of claim 1, further comprising:
    a summation element configured to add the first and second compensation signals to generate a composite compensation signal; and
    a digital-to-analog converter configured to receive the composite compensation signal and to generate an analog correction signal based thereupon, which is fed back into the main signal path to mitigate the first chopper ripple error and the second chopper ripple error.

3. The system of claim 1, wherein the first chopping correction circuit comprises:
    a first chopping modulator configured to modulate the input signal by chopping the input signal at the first frequency; and
    a first chopping demodulator located downstream of the first chopping modulator and configured to demodulate the input signal by chopping the input signal at the first frequency.

4. The system of claim 3, wherein the second chopping correction circuit comprises:
    a second chopping modulator configured to modulate the input signal by chopping the input signal at the second frequency, which is different than the first frequency; and
    a second chopping demodulator located downstream of the second chopping modulator and configured to demodulate the input signal by chopping the input signal at the second frequency.

5. The system of claim 4, wherein the main signal path comprises:
    an analog-to-digital converter located downstream of the first chopping modulator and the second chopping modulator and configured to convert the input signal from an analog signal to a digital signal.

6. The system of claim 4, wherein the main signal path comprises:
    a linear amplifier located downstream of the first chopping modulator and the second chopping modulator and configured to increase an amplitude of the input signal.

7. The system of claim 4, further comprising:
    a sensor configured to provide the input signal to the main signal path;
    wherein the second chopping modulator comprises a current inverter configured to chop the input signal by inverting a bias current provided to the sensor.

8. The system of claim 1, wherein the first feedback loop comprises:
    a first chopper switch configured to chop a feedback signal received from the main signal path at the first frequency to generate a first input signal; and
    a first digital integrator located downstream of the first chopper switch and configured to integrate the first input signal to generate the first compensation signal.

9. The system of claim 8, wherein the second feedback loop comprises:
    a second digital integrator configured to integrate the feedback signal to generate a second input signal; and a second chopper switch configured to chop the second input signal at the first frequency to generate the second compensation signal.

10. A sensor system, comprising:
  a sensor configured to provide a sensor signal corresponding to a physical quantity measured by the sensor to a main signal path;
  a signal modification circuit configured to receive the sensor signal, to modify the sensor signal, and to generate an output signal;
  a first chopping correction circuit configured to chop the sensor signal at a first frequency to reduce an offset error of the sensor signal;
  a first feedback loop configured to generate a first compensation signal based on a first feedback signal received from the main signal path, which mitigates a first chopper ripple error generated by the first chopping correction circuit;
  a second chopping correction circuit configured to chop the sensor signal at a second frequency to reduce the offset error; and
  a second feedback loop configured to generate a second compensation signal based on a second feedback signal received from the main signal path, which mitigates a second chopper ripple error generated by the second chopping correction circuit.

11. The sensor system of claim 10, wherein the second chopping correction circuit comprises:
  a second chopping modulator configured to modulate the sensor signal by chopping the sensor signal at the second frequency, which is different than the first frequency; and
  a second chopping demodulator located downstream of the second chopping modulator and configured to demodulate the sensor signal by chopping the sensor signal at the second frequency.

12. The sensor system of claim 11, wherein the second chopping modulator comprises a current inverter configured to chop the sensor signal by inverting a bias current provided to the sensor.

13. The sensor system of claim 10, wherein the first chopping correction circuit comprises:
  a first chopping modulator configured to modulate the sensor signal by chopping the sensor signal at the first frequency; and
  a first chopping demodulator located downstream of the first chopping modulator and configured to demodulate the sensor signal by chopping the sensor signal at the first frequency.

14. The sensor system of claim 10, wherein the first feedback loop comprises:
  a first chopper switch configured to chop the first feedback at the first frequency to generate a first input signal; and
  a first digital integrator located downstream of the first chopper switch and configured to integrate the first input signal to generate the first compensation signal.

15. The sensor system of claim 10, wherein the second feedback loop comprises:
  a second digital integrator configured to integrate the second feedback signal to generate a second input signal; and
  a second chopper switch configured to chop the second input signal at the first frequency to generate the second compensation signal.

16. The sensor system of claim 10, further comprising:
  a summation element configured to add the first and second compensation signals to generate a composite compensation signal; and
  a digital-to-analog converter configured to receive the composite compensation signal and to generate an analog correction signal based thereupon.

17. The sensor system of claim 10,
  wherein the first feedback loop comprises a first comparator configured to receive the feedback signal and to compare the feedback signal to a first threshold value to generate a first digital signal that is provided to a first digital integrator;
  wherein the second feedback loop comprises a second comparator configured to receive the feedback signal and to compare the feedback signal to a second threshold value to generate a second digital signal that is provided to a second digital integrator.

18. A method of reducing offset errors in a signal, comprising:
  providing an input signal to a main signal path comprising a first chopping correction circuit and a second chopping correction circuit configured to reduce an offset within the input signal;
  providing a first feedback signal from the main signal path to a first feedback loop and a second feedback signal from the main signal path to a second feedback loop;
  generating a first compensation signal based upon the first feedback signal that mitigates a first chopper ripple error generated by the first chopping correction circuit; and
  generating a second compensation signal based upon the second feedback signal that mitigates a second chopper ripple error generated by the second chopping correction circuit.

19. The method of claim 18, further comprising:
  adding the first compensation signal and the second compensation signal to generate a composite compensation signal.

20. The method of claim 19, further comprising:
  converting the composite compensation signal to an analog correction signal that is provided to the main signal path to mitigate the first chopper ripple error and the second chopper ripple error.

* * * * *